United States Patent
Lin et al.

(10) Patent No.: US 7,166,881 B2
(45) Date of Patent: Jan. 23, 2007

(54) MULTI-SENSING LEVEL MRAM STRUCTURES

(75) Inventors: Wen Chin Lin, Hsin-Chu (TW); Denny D. Tang, Saratoga, CA (US); Chien-Chung Hung, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 10/685,824

(22) Filed: Aug. 23, 2004

(65) Prior Publication Data

US 2006/0038210 A1    Feb. 23, 2006

(51) Int. Cl.
*H01L 29/76* (2006.01)

(52) U.S. Cl. .............. 257/295; 257/421; 257/E21.665; 257/E29.042; 257/E29.179; 438/3; 438/240

(58) Field of Classification Search .............. 257/295, 257/421, E21.665, E29.042, E29.179
See application file for complete search history.

(56) References Cited

U.S. PATENT DOCUMENTS

| 6,005,800 | A | 12/1999 | Koch et al. | |
|---|---|---|---|---|
| 6,335,890 | B1 | 1/2002 | Reohr et al. | |
| 6,469,926 | B1* | 10/2002 | Chen | 365/158 |
| 6,490,217 | B1 | 12/2002 | DeBrosse et al. | |
| 6,509,621 | B1 | 1/2003 | Nakao | |
| 6,522,579 | B1 | 2/2003 | Hoenigschmid | |
| 6,567,299 | B1 | 5/2003 | Kunikiyo et al. | |
| 6,577,529 | B1* | 6/2003 | Sharma et al. | 365/158 |
| 6,590,803 | B1 | 7/2003 | Saito et al. | |
| 6,593,608 | B1* | 7/2003 | Sharma et al. | 257/295 |
| 6,594,191 | B1 | 7/2003 | Lammers et al. | |
| 6,621,731 | B1 | 9/2003 | Bessho et al. | |
| 6,661,689 | B1 | 12/2003 | Asao et al. | |
| 6,693,822 | B1 | 2/2004 | Ito | |
| 6,693,826 | B1 | 2/2004 | Black, Jr. et al. | |
| 6,757,189 | B1* | 6/2004 | Hung et al. | 365/158 |
| 6,924,520 | B1* | 8/2005 | Park et al. | 257/295 |
| 2005/0073878 | A1* | 4/2005 | Lin et al. | 365/158 |

OTHER PUBLICATIONS

F. Montaigne, et al., "Enhanced Tunnel Magnetoresistance at High Bias Voltage in Double-Barrier Plannar Junctions", vol. 73, No. 19, Nov. 9, 1998, American Institute of Physics Y. Saito, et al., "Correlation Between Barrier Width, Barrier Height, and DC Bias Voltage Dependences on the Magnetoresistance Ratio in IR-MN Exchanged Biased Single and Double Tunnel Junctions", vol. 39, pp. L1035-L1038, Part 2 No. 10B, Oct. 2000, The Japan Society of Applied Physics.

* cited by examiner

*Primary Examiner*—Andy Huynh
(74) *Attorney, Agent, or Firm*—Haynes and Boone, LLP

(57) ABSTRACT

The present disclosure provides an improved magnetic memory cell. The magnetic memory cell includes a switching element and two magnetic tunnel junction (MTJ) devices. A conductor connects the first and second MTJ devices in a parallel configuration, and serially connecting the parallel configuration to an electrode of the switching element. The resistance of the first MTJ device is different from the resistance of the second.

18 Claims, 7 Drawing Sheets

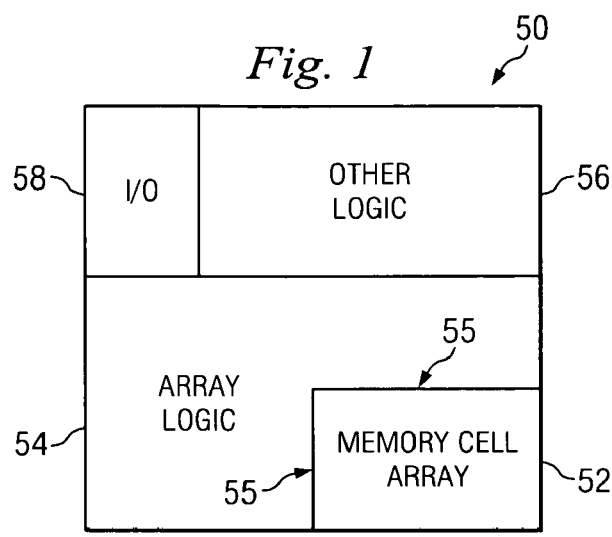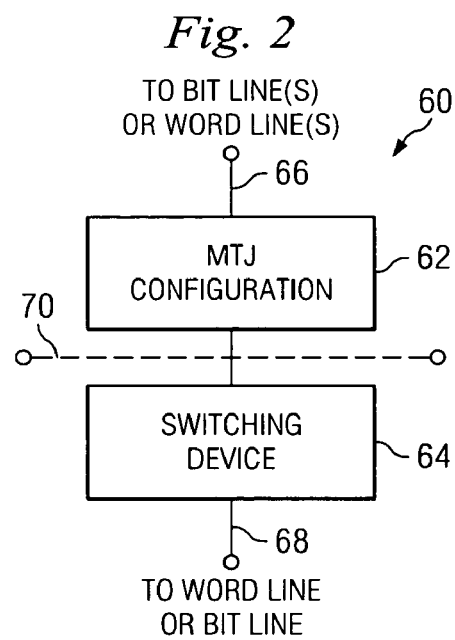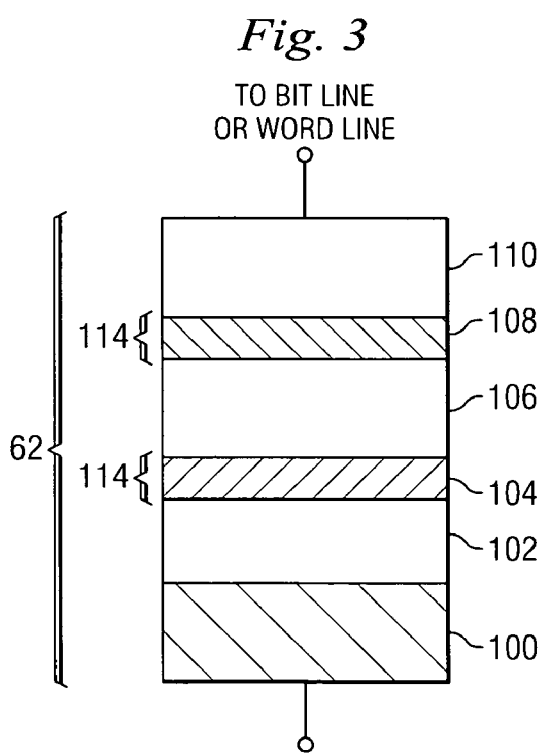

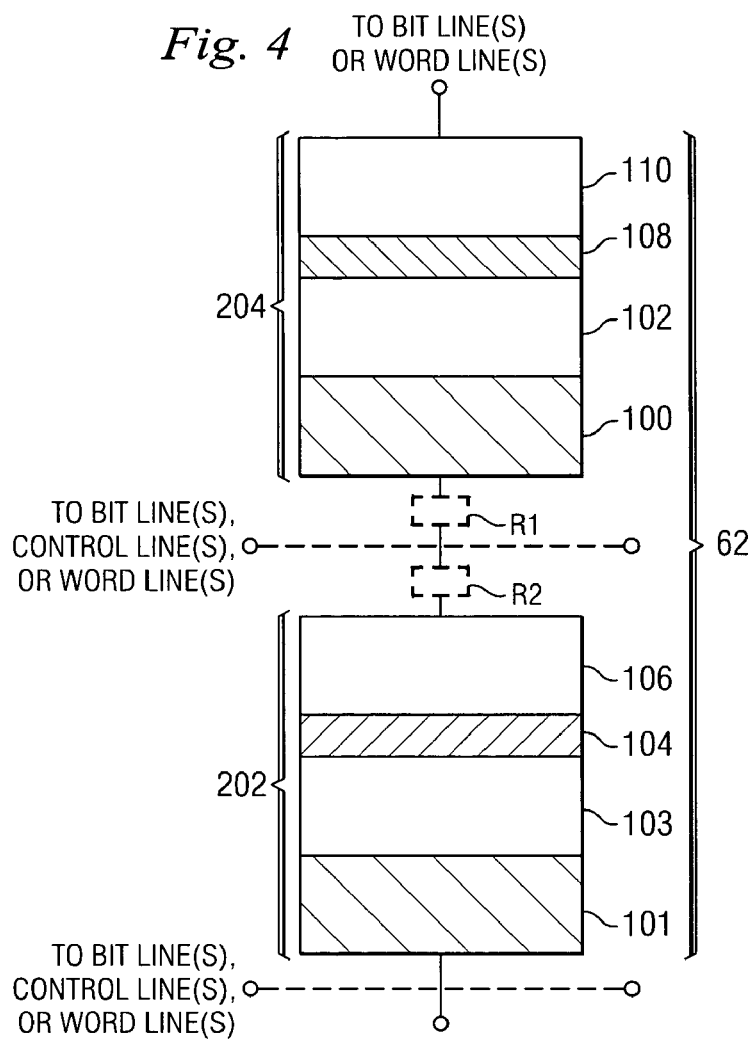
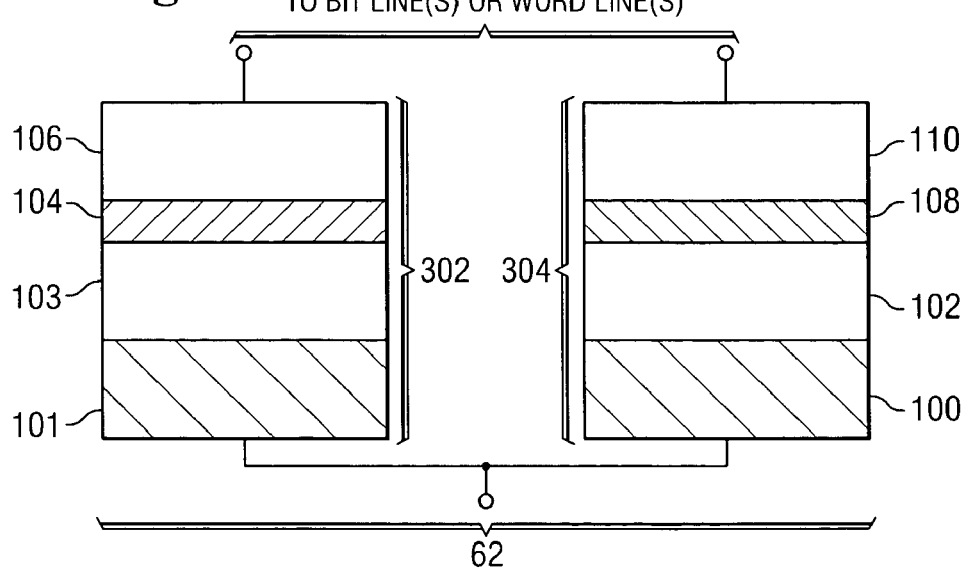

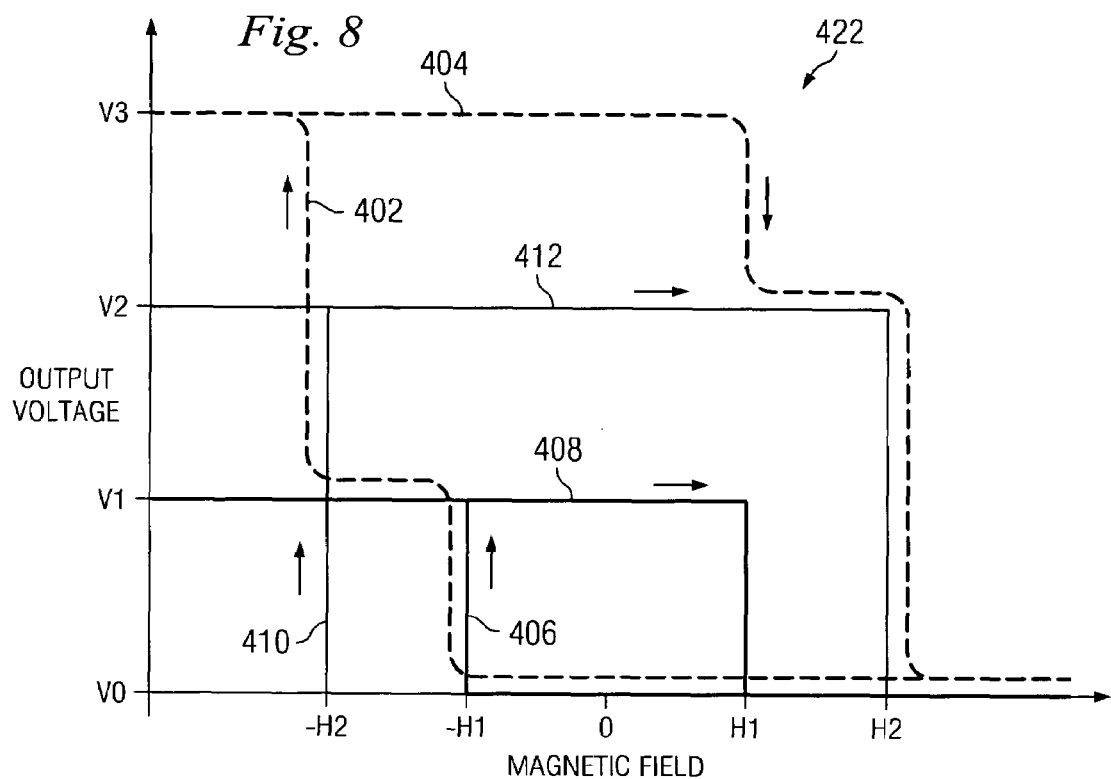
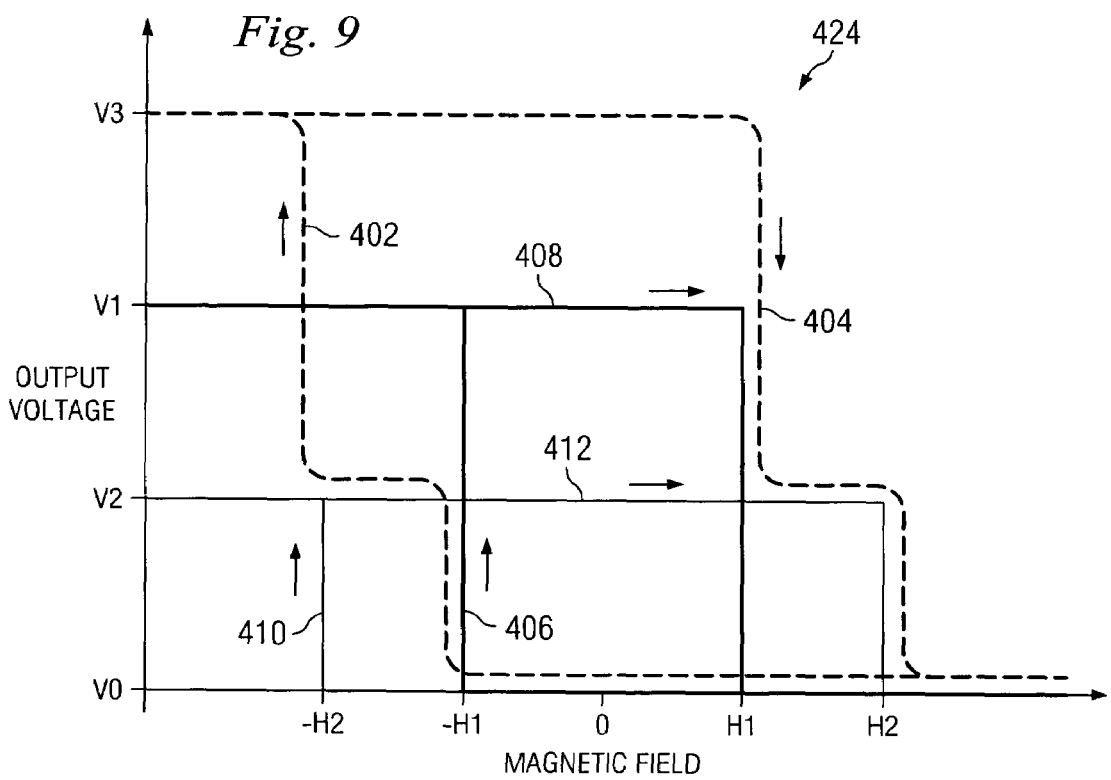

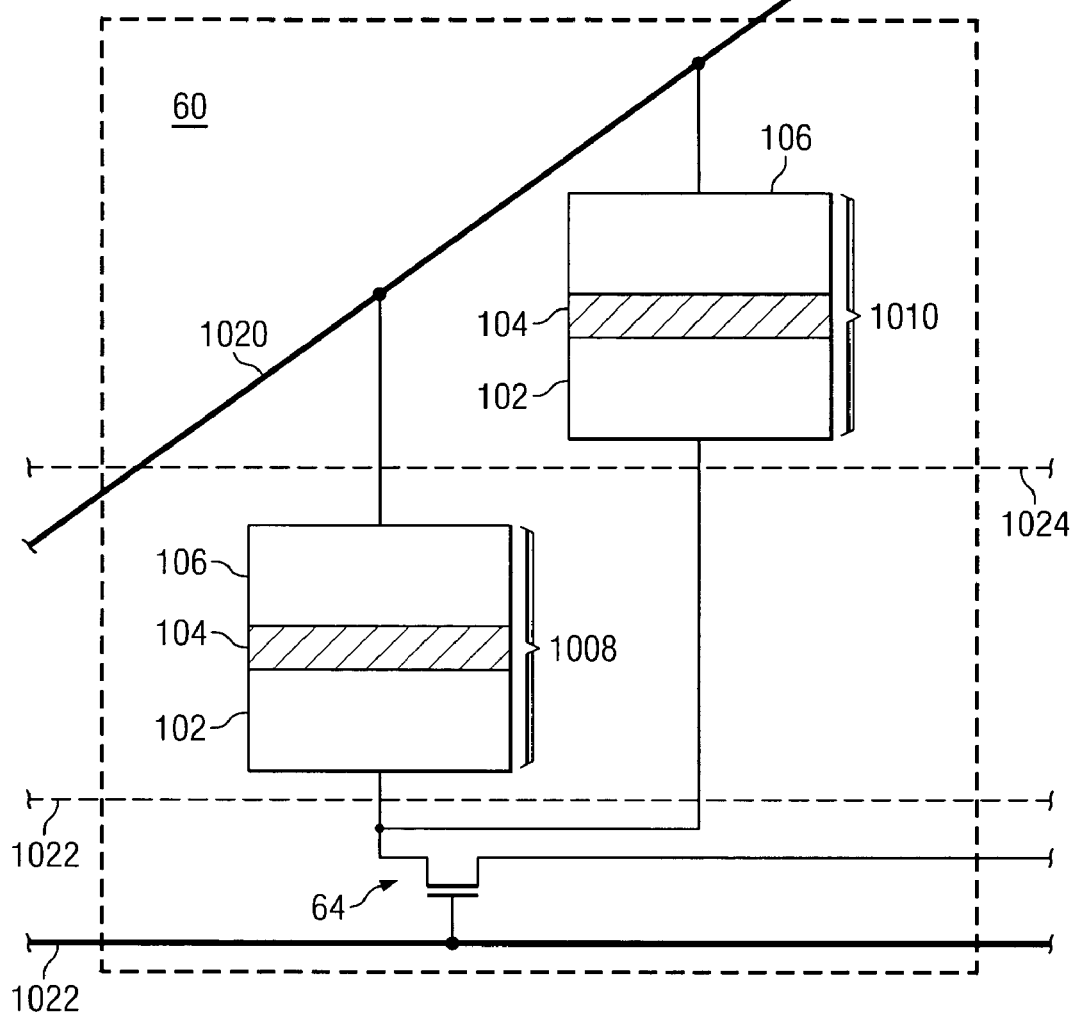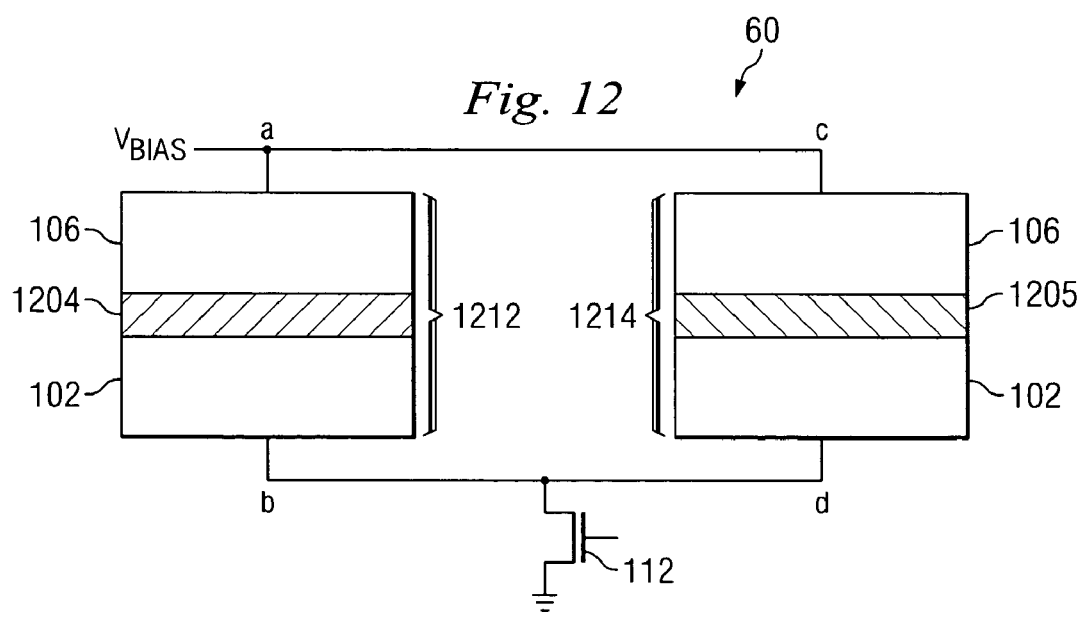

MULTI-SENSING LEVEL MRAM STRUCTURES

BACKGROUND

The present disclosure relates generally to the field of nonvolatile memory devices, and more specifically to a multiple level sensing magnetic tunnel junction (MTJ) memory cell devices.

The relentless demand for evermore compact, portable, and low cost consumer electronic products has driven electronics manufacturers to develop and manufacture nonvolatile, high density electronic storage devices having low power consumption, increased storage capacity, and a low cost. Nonvolatile memory devices are desirable in these applications because the stored data can be easily preserved. In some nonvolatile memory devices, the data is preserved even when a power supply is exhausted or disconnected from the memory device. Other nonvolatile memory devices may require continuous power, but do not require refreshing of the data. Low power consumption may also be desirable because smaller power sources can be used, reducing the size of consumer electronic devices. To meet these requirements, manufacturers have begun to utilize magnetic random access memory (MRAM) as one solution that meets the requirements of many consumer electronic applications.

The present disclosure relates to MRAM based on a magnetic tunnel junction (MTJ) cell. An MTJ configuration can be made up of three basic layers, a "free" ferromagnetic layer, an insulating tunneling barrier, and a "pinned" ferromagnetic layer. In the free layer, the magnetization moments are free to rotate under an external magnetic field, but the magnetic moments in the "pinned" layer cannot. The pinned layer can be composed of a ferromagnetic layer and/or an anti-ferromagnetic layer which "pins" the magnetic moments in the ferromagnetic layer. A very thin insulation layer forms the tunneling barrier between the pinned and free magnetic layers. In order to sense states in the MTJ configuration, a constant current can be applied through the cell. As the magneto-resistance varies according to the state stored in the cell, the voltage can be sensed over the memory cell. To write or change the state in the memory cell, an external magnetic field can be applied that is sufficient to completely switch the direction of the magnetic moments of the free magnetic layers.

MTJ configurations often employ the Tunneling Magneto-Resistance (TMR) effect, which allows magnetic moments to quickly switch the directions in the magnetic layer by an application of an external magnetic field. Magneto-resistance (MR) is a measure of the ease with which electrons may flow through the free layer, tunneling barrier, and the pinned layer. A minimum MR occurs in an MTJ configuration when the magnetic moments in both magnetic layers have the same direction or are "parallel". A maximum MR occurs when the magnetic moments of both magnetic layers are in opposite directions or are "anti-parallel."

SUMMARY

A technical advance is achieved by an improved magnetic memory cell and integrated circuit device utilizing a plurality of magnetic memory cells. In one embodiment, the magnetic memory cell includes a switching element and two magnetic tunnel junction (MTJ) devices. A conductor connects the first and second MTJ devices in a parallel configuration, and serially connecting the parallel configuration to an electrode of the switching element. The resistance of the first MTJ device is different from the resistance of the second.

In some embodiments, the first MTJ device includes a first tunnel barrier that is of a different area than a tunnel barrier of the second MTJ device. In other embodiments, the first MTJ device includes a first tunnel barrier that is of a different thickness than a tunnel barrier of the second MTJ device. In still other embodiments, the first MTJ device is a multi-junction MTJ device. In yet still other embodiments, a resistor is configured to be in series with the second MTJ device. The second resistance is a combination of a resistance of the second MTJ device and the resistor.

In another embodiment, a magnetic memory cell includes first, second, and third terminals and a conductor. A CMOS transistor having source, drain, and gate electrodes is also provided. The gate electrode is connected to the third terminal, one of either the source or drain is connected to the second terminal, and the other of either the source or drain is connected to the conductor. First and second MTJ devices are also provided. The first MTJ device includes a serially connected first free layer, first tunneling barrier, and first pinned layer. The first free layer is also connected to the first terminal and the first pinned layer is also connected to the conductor. The second MTJ device includes a serially connected second free layer, second tunneling barrier, and second pinned layer. The second free layer is also connected to the first terminal and the second pinned layer is also connected to the conductor. A first resistance between the first terminal to the second terminal through the first MTJ device is different from a second resistance between the first terminal to the second terminal through the second MTJ device.

In another embodiment, an integrated circuit includes a plurality of bit lines, word lines, and program lines and a plurality of magnetic memory cells. Each of the plurality of magnetic memory cells includes a conductor, a transistor, and two MTJ devices. The transistor has source, drain, and gate electrodes, the gate electrode connected to one of the word lines, one of either the source or drain connected to a first program line, and the other of either the source or drain connected to the conductor. The first MTJ device includes a serially connected first free layer, first tunneling barrier, and first pinned layer, the first free layer also being connected to a first bit line and the first pinned layer also being connected to the conductor. The second MTJ device includes a serially connected second free layer, second tunneling barrier, and second pinned layer, the second free layer also being connected to the first bit line and the second pinned layer also being connected to the conductor. A first resistance between the first bitline to the conductor through the first MTJ device is different from a second resistance between the first bitline to the conductor through the second MTJ device.

The foregoing has outlined preferred and alternative features of several embodiments so that those skilled in the art may better understand the detailed description that follows. Additional features will be described below that further form the subject of the claims herein. Those skilled in the art should appreciate that they can readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure.

BRIEF DESCRIPTION OF THE DRAWINGS

The present disclosure is best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIG. 1 is a block diagram of an integrated circuit device having a memory cell array according to one embodiment of the present disclosure.

FIG. 2 is a block diagram of one embodiment of a memory cell for use in the memory cell array of FIG. 1.

FIG. 3 illustrates a cross-sectional view of a first embodiment of a MTJ configuration for use in the memory cell of FIG. 2.

FIG. 4 illustrates a cross-sectional view of a second embodiment of a MTJ configuration for use in the memory cell of FIG. 2.

FIG. 5 illustrates a cross-sectional view of a third embodiment of a MTJ configuration for use in the memory cell of FIG. 2.

FIGS. 7–9 are graphs illustrating hysteresis characteristics of the multiple level sensing MRAM cell shown in FIG. 2.

FIGS. 10–11 illustrate schematic views of the MRAM cell and MRAM array embodiment of magnetic memory constructed according to aspects of the present disclosure.

FIG. 12. illustrates a cross-sectional view of a first embodiment of an MRAM cell of FIG. 10 with different surface areas for each MTJ device.

DETAILED DESCRIPTION

Figure 6:
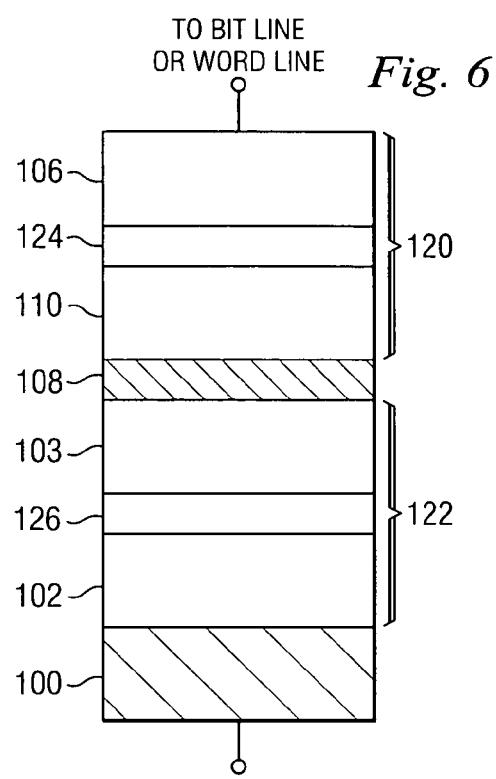
FIG. 6 illustrates a cross-sectional view of a fourth embodiment of a MTJ configuration for use in the memory cell of FIG. 2.

The present disclosure relates to the field of integrated circuits and nonvolatile memory devices. To illustrate the disclosure, a specific example and configuration of an integrated circuit, a memory cell array, and memory cell are illustrated and discussed. It is understood, however, that this specific example is only provided to teach the broader inventive concept, and one of ordinary skill in the art can easily apply the teachings of the present disclosure to other magnetic and/or electrical circuits and structures. Also, it is understood that the integrated circuit and memory cell discussed in the present disclosure include many conventional structures formed by conventional processes.

Referring now to FIG. 1 of the drawings, an integrated circuit 50 is one example of a circuit that can benefit from the present disclosure. The integrated circuit 50 includes a memory cell array 52 that can be controlled by an array logic 54 through an interface 55. It is well known in the art that various logic circuitry, such as row and column decoders and sense amplifiers, can be included in the array logic 54, and that the interface 55 may include one or more bit lines, gate lines, digit lines, control lines, word lines, and other communication paths to interconnect the memory cell array 52 with the array logic 54. These communication paths will hereinafter be referred to as bit lines, it being understood that different applications of the present disclosure may use different communication paths. The integrated circuit can further include other logic 56 such as counters, clock circuits, and processing circuits, and input/output circuitry 58 such as buffers and drivers.

Referring to FIG. 2, the memory cell array 52 of FIG. 1 may include one or more magnetic random access memory (MRAM) cells 60. Each MRAM cell 60 does not need to be commonly configured, but for the sake of example, can be generically described as including a configuration of MTJ devices 62 and a switching device 64. Examples of various embodiments of the MTJ configuration 62 are discussed in further detail below, and examples of the switching device 64 include a metal oxide semiconductor (MOS) transistor, a MOS diode, and/or a bipolar transistor. The memory cell 60 can store 1, 2, 3, 4 or more bits, but for the sake of further example, a two bit configuration will be discussed. Also, the present disclosure will focus on the use of single and double junction MTJ devices with different MR ratios, where there can be four magneto-resistance levels. The different MR ratios facilitate the capability of sensing at least four levels of magneto-resistance, and the capacity to store at least two bits.

The MRAM cell 60 includes two terminals, an first terminal 66, a second terminal 68, and a third terminal 70. For the sake of example, the first terminal 66 is connected to one or more bit lines and produces an output voltage in a read operation, which is provided to the bit line(s). The second terminal 68 is connected to one or more word lines, which can activate the cell 60 for a read or write operation. The third terminal 70 may be proximate to a control line, such as a gate or digit line, and can provide a current for producing a magnetic field to effect the MTJ configuration 62. It is understood that the arrangement of bit lines, word lines, control lines, and other communication signals can vary for different circuit designs, and the present discussion is only providing one example of such an arrangement.

Referring to FIG. 3, one embodiment of the MTJ configuration 62 includes two free ferromagnetic layers 106 and 110 and two tunneling barriers 104 and 108 connected in serial to a pinned layer 102 and an anti-ferromagnetic layer 100. The barriers 104 and 108 can be, for example $SiO_x$, $SiN_x$, $SiO_xN_y$, $AlO_x$, $TaO_x$, $TiO_x$, $AlN_x$, or other non-conductive materials. The barriers 104 and 108 can also have different MR ratios. Therefore, barrier 108 can be formed of a different material or a variation of material similar to the other junction 104. The tunneling barriers 104 and 108 can be formed by chemical vapor deposition (CVD), plasma enhanced chemical vapor deposition (PECVD), electrochemical deposition, physical vapor deposition, molecular manipulation or any other method that is known by one who is skilled in the art. In FIG. 3, the ferromagnetic free layers 106 and 110 can form magnetic junctions 114 with the tunneling barriers 104 and 108. These magnetic junctions 114 can have different MR ratios.

In one example, the MR ratios for barriers 104 and 108 are 60% and 30% respectively (a 2:1 ratio). Thus, for barrier 108, the logical status of 1 has a corresponding magneto-resistance of 1, and the logical status of 0 has a magneto-resistance of 1.3. Similarly, for barrier 104, the logical status of 1 has a corresponding magneto-resistance of 1, and the logical status of 0 has a magneto-resistance of 1.6. The example also assumes that the free layer 106 and free layer 110 are of electrically different materials causing the switching thresholds of the magnetic moment direction to differ. In a high magnetic field, both free layer 106 and layer 110 can align their magnetic moments in the same and parallel direction. In a low magnetic field, only one free layer 106 can change magnetic moment leaving the other free layer undisturbed. Accordingly, the free layers 106 or 110 can be written to further depending upon the location of the control line. The free ferromagnetic layers 106 and 110 could be made from ferromagnetic materials such as, for example, NiFe and NiFeCo, or the free layers 106 and 110 could be comprised of two ferromagnetic layers with a Ru spacer sandwiched there between. The composite free/pinned layer structure is known as a synthetic anti-ferromagnetic structure (SAF). The free or ferromagnetic layers 106 and 110 can be formed by chemical vapor deposition (CVD), plasma enhanced chemical vapor deposition (PECVD), atomic layer deposition (ALD), electro-chemical deposition, physical vapor deposition, molecular manipulation or any other method that is known by one who is skilled in the art. The pinned magnetic layer 102 can be an anti-ferromagnetic layer where the magnetic moments are magnetically "pinned" by either an anti-ferromagnetic layer or an anti-ferromagnetic exchange layer placed adjacent to the ferromagnetic material, such as a Ru spacer. Anti-ferromagnetic layers can be also made from materials such as MnFe, IrMnIn or any other suitable anti-ferromagnetic materials. These layers can be formed by chemical vapor deposition (CVD), plasma enhanced chemical vapor deposition (PECVD), ALD, electro-chemical deposition, physical vapor deposition, molecular manipulation or any other method that is known by one who is skilled in the art.

Writing to the multi-sensing level MTJ 62 can be accomplished using a plurality of current paths (e.g., control lines lines, bit lines, and word lines FIG. 1), which can be orthogonal to each other and cross proximate to the selected MTJ structure 62. Writing to the free layer 106 and 110 can be provided by a plurality of control lines. Current can be supplied to selected control lines wherein an induced magnetic field can change the magnetic moments of the free layer 106 and 110. The control lines may be insulated from the MTJ structure 62 by a dielectric and may be placed at a specific location or distance relative to the MTJ structure 62. The magnitude of the current can depend upon which free layer is selected to be written. Therefore, a low induced current to the control line may provide an induced magnetic filed for the closest free layer, while a larger current can provide an induced magnetic field to the next free layer. Alternatively, the two magnetic junctions 114 in the memory structure 62 can have differing resistance characteristics. The differing resistance characteristics may be realized from materials or process method(s) used to form the different tunneling barriers 104 and 108. MTJ configuration layers tend to decrease in resistance gradually under an applied voltage. Therefore, because the multiple MTJ structure 62 can be comprised of barrier layers 104 and 108 of differing magneto-resistive (MR) ratio, multiple resistance level sensing is possible.

In some cases, a two step writing process may be needed. For example, a large initial current can be supplied that writes free layers 106 and 110, then a smaller current could be supplied that changes the state of the nearest free layer 106 or 110. Alternately, the larger current can be turn into a smaller current reflected opposite of the initial large current injection. This small current reflection reverses the switching field of the smaller free layer 106 or 110. Two step writing can be dedicated to the writing of one free layer 106 or 110 only, without disturbing the other free layer 106 or 110 in the same MTJ structure 62.

Table 1 shows four kinds of conditions for the barrier layers 104 or 108 with different MR ratio structure 62 in FIG. 3. In condition 1 of Table 1, the tunneling resistance can be observed to remain at a minimum while the magnetic moments of both ferromagnetic free layers 106 and 110 and the magnetic moment of the pinned layer 102 are parallel. Under condition 3, larger serial resistances can be realized with both free layers 106 and 110 in parallel but anti-parallel to the magnetic moment of the pinned layer 102. Under condition 2, where the magnetic moments of the free layers 106 and 110 are anti-parallel but free layer 106 is parallel with the pinned layer 102, the serial resistance can be greater than in condition 1. As seen in condition 4, serial resistance can be maximized when the free layers 106 and 110 are anti-parallel and the pinned layer 102 is anti-parallel to free layer 106.

TABLE 1

| Layer | Magnetic Moment Direction | | | |
|---|---|---|---|---|
| | Condition 1 | Condition 2 | Condition 3 | Condition 4 |
| Free Layer 110 | ⇒ | ⇐ | ⇐ | ⇒ |
| Free Layer 106 | ⇒ | ⇒ | ⇐ | ⇐ |
| Pinned Layer | ⇒ | ⇒ | ⇒ | ⇒ |
| Tunneling Resistance | Minimum | | | |
| Barrier 108 (MR ratio 30%) | 1 | 1.3 | 1 | 1.3 |
| Barrier 104 (MR ratio 60%) | 1 | 1 | 1.6 | 1.6 |
| Serial Resistance | 2 | 2.3 | 2.6 | 2.9 |

Turning now toward the reading or sensing function, the MTJ structure 62 with a serial structure has four sensing levels. The binary logical states 0 or 1 of the free layer 106 or free layer 110 can be identified by a multi-level reference circuit included in the array logic 54 (FIG. 1). Since the resistance of the tunnel barrier 104 or 108 varies approximately exponentially to the thickness of the barrier, the electrical current flows generally perpendicular through the barrier 104 or 108. The likelihood of a charge carrier tunneling across the barrier 104 or 108 decreases with the increasing barrier thickness so that the only carriers that tunnel across the junction 114 are those which transverse perpendicular to the junction layer 114. The state of the memory structure 62 can be determined by measuring the resistance of the structure 62 when a read current, much smaller than the write currents, is passed perpendicularly through the MTJ structure 62. The self-field of this read current can be negligible and does not affect the magnetic state of the memory cell. The probability of a charge carrier tunneling across the tunnel barrier 104 or 108 can depend on the relative alignment of the magnetic moments of the free layers 106 or 110. The tunneling current can be spin polarized, which means that the electrical current passing from one of the ferromagnetic layers 106 or 110 to, for example, the pinned layer 102, can be predominantly composed of electrons of one spin type (spin up or spin down) depending on the orientation of the magnetization of the ferromagnetic layer 106 or 110. The degree of the current's spin polarization can be determined by the electronic band structure of the magnetic material composing the ferromagnetic layer 106 or 110 at the interface of the ferromagnetic free layer 106 or 110 with the tunnel barrier 104 or 108. The first ferromagnetic layer 106 thus acts as a spin filter. The probability that the charge carriers can tunnel depends on the availability of electronic states of the same spin polarization as the spin polarization of the electronic current in the second ferromagnetic free layer 110. Usually, when the magnetic moment in the second ferromagnetic layer 110 is aligned to the magnetic moment of the first ferromagnetic layer 106, there are more available electronic states than when the magnetic moment of the second ferromagnetic 110 layer is aligned in opposite direction to that of the first free layer 106. Thus, the tunneling probability of the charge carriers can be high when the magnetic moments of both layers 106 and 110 are aligned, and can be low when the magnetic moments are anti-aligned. Therefore, when the magnetic moments are neither aligned nor anti-aligned, the tunneling probability takes an intermediate value. Thus, the electrical resistance of the MTJ structure 62 depends on both polarization of the electrical current and the electronic states in both of the ferromagnetic layers 106 and 110. As a result, the two possible magnetization directions of the free layers 106 or 110 uniquely define two possible bit states (0 or 1) of the MTJ structure 62.

An MRAM structure for a "stacked" MTJ may consist of multiple layers of magnetic tunneling junctions and ferromagnetic free layers allowing even greater levels of sensing levels to be resolved. For example, in the case of a three junction system with three different MR ratios, eight (2*2*2=8, including 000, 001, 010, 011, 100, 101, 110, 111) levels of sensing levels could be resolved, where each magnetic junction contributes two sensing levels. In this example, there would be three bits in the cell that share the same transistor. The relationship between $n_m$, the number of magnetic junctions, and $n_s$, the number of magneto-resistance states can be expressed as $n_s=2^{\wedge}(n_m)$.

Referring now to FIG. 4, in a second embodiment, a pair of multiple MR sensing MTJ devices 202 and 204 are serially connected to form the MTJ configuration 62. The MTJ device 202 includes a free layer 106, a barrier 104, a pinned layer 103, and an anti-ferromagnetic layer 101. Similarly, the MTJ device 204 includes a free layer 110, a barrier 108, a pinned layer 102, and an anti-ferromagnetic layer 100. The pinned layers 102, 103 may be part of a larger, contiguous ferromagnetic layer, and the anti-ferromagnetic layers 100, 101 may be a part of a larger, contiguous anti-ferromagnetic layer. The embodiment of FIG. 4 operates in the same manner as the embodiment in FIG. 3 except for the writing process. The control lines write to the control lines can induce a magnetic field within the free layers 106 and 110 allowing each free layer 106 and 110 to be written without disturbing the other free layer 106 or 110. One advantage of the MTJ configuration 62 is that a two step writing process may not be required, resulting in an increased programming speed.

In some embodiments, the MTJ configuration 62 may also include one or more resistive elements in series between MTJ devices. For example, in FIG. 4, resistive elements R1 and R2 may be placed in series with MTJ device 202 and MTJ device 204. The resistive elements R1 and R2 would shift the magneto-resistance ratios, but would not change the general operation of the memory cell embodiment. The resistive element can be made from materials such as, for example, a layer of diamond-like carbon (DLC), a layer of Ti/Ta/X, where X is a metal, a layer of Ti/TaN/TiW, and other materials. The material and/or thickness of the resistive element are selected so that the resistive element does not behave as an anti-fuse during programming of the MTJ configuration 62. The resistive element could be formed by chemical vapor deposition (CVD), plasma enhanced chemical vapor deposition (PECVD) electro-chemical deposition, physical vapor deposition, molecular manipulation or any other method that is known by one who is skilled in the art.

Table 2 illustrates the logical binary states of the MTJ configuration cell 62 in FIG. 4. As shown under condition 1, the tunneling resistance can be minimized where the magnetic moments of both ferromagnetic free layers 106 and 110 are in parallel and where they are both parallel with the magnetic moment of the pinned layer 102. Condition 4 demonstrates that a maximum serial resistance can be realized with both free layers 106 and 110 in parallel and anti-parallel to the magnetic moment of the pinned layer 102. Under condition 2 where the magnetic moments of the free layers 106 and 110 are anti-parallel and where free layer 106 is parallel with the pinned layer 102, the serial resistance can be greater than it is in Table 2, condition 1. In condition 4, serial resistance can be slightly lower than the maximum when both free layers 106 and 110 magnetic moments are anti-parallel and the pinned layer 102 is anti-parallel to free layer 106.

TABLE 2

| | Magnetic Moment Direction | | | |
| --- | --- | --- | --- | --- |
| Layer | Condition 1 | Condition 2 | Condition 3 | Condition 4 |
| Free Layer 110 | ⇒ | ⇐ | ⇒ | ⇐ |
| Free Layer 106 | ⇒ | ⇒ | ⇐ | ⇐ |
| Pinned Layer | ⇒ | ⇒ | ⇒ | ⇒ |
| Tunneling Resistance | Minimum | | | |
| Barrier 108 (MR ratio 30%) | 1 | 1.3 | 1 | 1.3 |
| Barrier 104 (MR ratio 60%) | 1 | 1 | 1.6 | 1.6 |
| Serial Resistance | 2 | 2.3 | 2.6 | 2.9 |

Referring now to FIG. 5, a third embodiment of the MTJ configuration 62 includes two sets of single junction MTJ devices 302 and 304 that are electrically connected in parallel. The MTJ device 302 includes a free layer 106, a barrier 104, a pinned layer 103, and an anti-ferromagnetic layer 101. Similarly, the MTJ device 304 includes a free layer 110, a barrier 108, a pinned layer 102, and an anti-ferromagnetic layer 100. The pinned layers 102, 103 may be part of a larger, contiguous ferromagnetic layer, and the anti-ferromagnetic layers 100, 101 may be a part of a larger, contiguous anti-ferromagnetic layer. The barriers 104, 108 in this case can be assigned different MR ratios. For example, the barrier 108 can have a MR ratio of 25% and the barrier 104 can have a MR ratio of 58%. The embodiment of the multiple level sensing MTJ configuration 62 of FIG. 5 operates in a similar manner to the embodiment in FIG. 4, with the differences identified below. Table 3 shows four kinds of conditions and four different levels of resistance in parallel. Each logical status of the ferromagnetic free layer 106 and ferromagnetic free layer 110 can be distinguished.

TABLE 3

| Layer | Magnetic Moment Direction | | | |
|---|---|---|---|---|
| | Condition 1 | Condition 2 | Condition 3 | Condition 4 |
| Free Layer 110 | ⇒ | ⇐ | ⇒ | ⇐ |
| Free Layer 106 | ⇒ | ⇒ | ⇐ | ⇐ |
| Pinned Layer | ⇒ | ⇒ | ⇒ | ⇒ |
| Tunneling Resistance | Minimum | | | |
| Barrier 108 (MR ratio 25%) | 1 | 1.25 | 1 | 1.25 |
| Barrier 104 (MR ratio 58%) | 1 | 1 | 1.58 | 1.58 |
| Parallel Resistance | 0.500 | 0.556 | 0.612 | 0.698 |

The parallel MTJ configuration 62 provides a more narrow range of magneto-resistances compared to the serial configuration discussed in the previous embodiments. Under condition 1, the tunneling resistance can be at a minimum when the magnetic moments of both ferromagnetic free layers 106 and 110 and the pinned layer 102 are in parallel. Under condition 4, a maximum in serial resistance can be realized with both free layers 106 and 110 parallel, but anti-parallel to the magnetic moment of the pinned layer 102. If the magnetic moments of the free layers 106 and 110 are anti-parallel, as in condition 2, and the free layer 106 is parallel, the serial resistance can be greater than it is in condition 1. Under condition 3, serial resistance can be slightly lower than the maximum when the magnetic moments of both free layers 106 and 110 are anti-parallel and the pinned layer 102 is anti-parallel to free layer 106. A parallel multiple level sensing configuration may be attractive in MRAM designs where larger currents may be supplied or where smaller voltage drops may be desired in the MRAM circuit.

Referring to FIG. 6, in a fourth embodiment of the MTJ configuration 62, a pair of multiple MR sensing MTJ devices can collectively include a synthetic anti-ferromagnetic (SAF) free structure 120, a barrier layer 108, a SAF pinned layer 122, and an anti-ferromagnetic layer 100. The SAF free structure 120 can include two ferromagnetic layers 106 and 110 sandwiching an anti-ferromagnetic exchange layer 124. Also, the SAF pinned layer 122 can include two ferromagnetic layers 103 and 102 sandwiching an anti-ferromagnetic exchange layer 126. The embodiment of FIG. 6 operates in a manner consistent with the embodiment of FIG. 3 except that the SAF layer is an alternative to a single free layer or pinned layer. The SAF layer(s) feature a flux-closed structure that reduces disturbance. Flux-closed structures are described in U.S. Pat. No. 6,166,948, which is hereby incorporated by reference.

Figure 7:
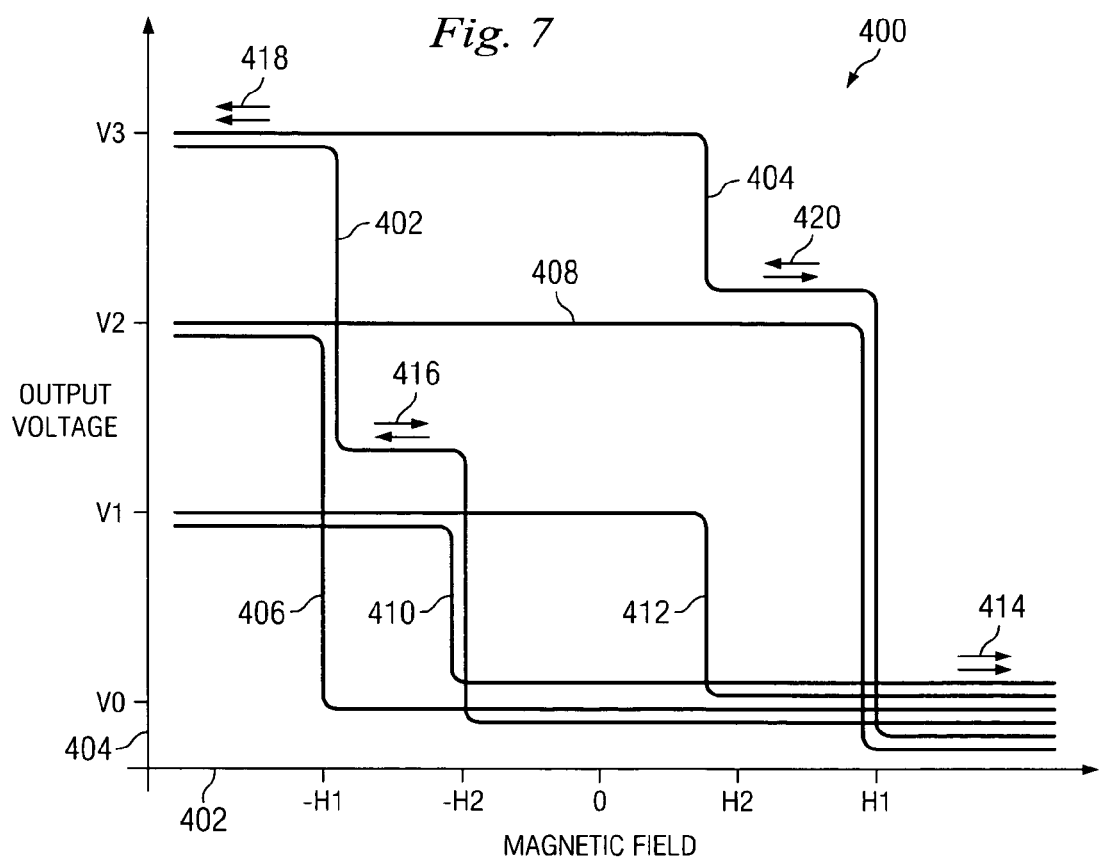

Referring now to FIG. 7, a hysteresis curve 400 of the MTJ structure 62 illustrate the voltage, magnetic field strength, and magnetic moments according to some embodiments of the present disclosure. Hysteresis curve 400 represents an embodiment where free magnetic layers 106 and 110 can be controlled by a single bit or control line, such as in FIG. 3. The magnetic fields associated with the two MTJ devices of the MTJ configuration 62 are identified as values H1 and H2, and the output voltages are identified as V0, V1, and V2. In the present example, it does not matter which MTJ device corresponds to the values H1 or H2, as long as H1≠H2. A horizontal axis 402 represents the magnetic field strength, and a vertical axis 404 represents the output voltage over the MTJ structure 62. Pairs of arrows 414, 416, 420 describe directions of magnetic moments in the free magnetic layers 106 and 110, with the upper arrow in the figure corresponding to layer 106 and the lower arrow corresponding to layer 110. A right direction (as shown in the figure) of an arrow indicates the parallel while a left direction of an arrow represents anti-parallel. First and second curves 402 and 404 described by solid lines indicate output voltage over the MTJ structure 62, which could be achieved for the application of various strengths of magnetic. Third and fourth curves 406 and 408 could indicate output voltage over one MTJ device ,and the fifth and sixth curves 410 and 412 could represent a voltage output over the other MTJ devices, Superimposing curve 406 on curve 410 and curve 408 over 412 could represent the hysteresis of a series multiple level sensing MTJ structures 62.

Referring now to FIGS. 8 and 9, hysteresis curves 422 and 424 of the MTJ structure 62 illustrate the voltage, magnetic field strength, and magnetic moments according to other further embodiments of the present disclosure. Hysteresis curves 422, 424 represent further embodiments where free magnetic layers 106 and 110 can be controlled by separate bit lines, such as in FIG. 3. In these embodiments, magnetic values H1 and H2 can be the same or different. The curve 422 and 424 of FIG. 8 can be associated with multiple free layers 106 and 110 connected to one bit or control line, and the curve 424 is associated with the other MTJ device connected to the other bit line. In FIG. 8, the output voltage V2 is greater than the output voltage V1, while in FIG. 9, the output voltage V1 is greater than the output voltage V2.

Therefore, the multiple level sensing MTJ configuration 62 gives a hysteresis curve 400 indicating at least four different stable levels, which are caused by magnetic directions in the magnetic free layers 106 and 110 as shown by arrows 414–420. Accordingly, the MTJ configuration 62 can memorize at least four bits of information corresponding to the four levels by the multiple MR ratios.

Referring to Table 4, the MTJ configuration 62 can be read by measuring a corresponding output voltage. Referring also to FIGS. 1 and 2, it is understood that the array logic 54 can select a desired memory cell 60 to read four bits of data from the MTJ configuration 62.

TABLE 4

| Output Voltage | Bit States |
|---|---|
| V0 | 00 |
| V1 | 10 |
| V2 | 01 |
| V3 | 11 |

Referring to Table 5, the MTJ configuration 62 can be written to by providing one or more specific magnetic fields. A combined magnetic field can be generated by two currents provided to the MTJ configuration 62, specifically to magnetic free layers 106 and/or 110. The direction of the combined magnetic field can be specified by the directions of the current in the bit line. The combined magnetic field allows directions in free magnetic layers 106 and/or 110 to be switched. A current source is part of the array logic 54 (FIG. 1) and controls the amount and directions of the current.

TABLE 5

| Magnetic Field | Bit States |
|---|---|
| H1 | 00 |
| H1 then −H2 | 10 |
| −H1 then H2 | 01 |
| −H2 | 11 |

Referring also to the embodiments of FIGS. 3 and 6, the magnetic fields associated with the two MTJ devices of the MTJ configuration 62 are identified as values H1 and H2. In the present example, it does not matter which MTJ device corresponds with the values H1 or H2, as long as H1≠H2. To store a logic "00" value in the MTJ configuration 62, a magnetic field, which is greater than or equal to H1 is applied to both magnetic junctions 114 in the parallel. To store a logic "10", two steps can be carried out. First, a magnetic field greater than or equal to H1 is applied to store the logic "00", and then a magnetic field between −H2 and −H1 can be applied to switch the direction of the magnetic moments in only one of the layers 106 or 110 (depending on their configuration). To store a logic "11" value, a magnetic field which is less than or equal to −H1 can be applied such that both magnetic junctions are set to the anti-parallel.

To store a logic "01", two steps can be carried out. First a magnetic field which is less than or equal to H1 can be applied to store the value "11", and then a magnetic field between +H2 and +H1 can be applied to switch the direction of the magnetic moments in only one of the layers 106 or 110 (depending on their configuration).

For the embodiments of FIGS. 4 and 5, in which the free layers 106 110 can be controlled by two independent bit lines, the values H1 and H2 can either be the same or set to different values. Furthermore, when two independent bit lines are used, each of the MTJ devices can be individually written with a corresponding bit. The method of writing to a single bit is a subset of the method described above with respect to writing two bits.

According to the above embodiments, the MTJ configuration 62 may not require active silicon-based isolation elements in order to isolate the memory cells in a memory array. The MTJ configuration 62 may be stacked memory elements or even three-dimensionally connected for fabrication on non-planar surfaces, curved, and spherical geometries, increasing device capacity. The MTJ configuration 62 may be fabricated by materials that are novel or non-conventional by semiconductor technologies.

An advantage of using MTJ configurations and configurations with multiple level sensing capabilities is that each MTJ configuration in the above discussed embodiments exhibits its own resistance characteristic due to the differing MR ratios of each MTJ configuration. The MR ratio of each MTJ can be controlled by differing the material or composition of each tunneling barrier 104 and 108. This allows each stacked MTJ configuration 62, as shown in FIG. 3, or the un-stacked configurations of FIGS. 4 and 5 to simultaneously store two bits. The present embodiments of the MTJ configuration 62 have the ability to sense at least four different logical states based on the differing MR ratios, and this allows for a two times increase in memory density within the same or similar area used in a single MTJ configuration.

Figure 11:
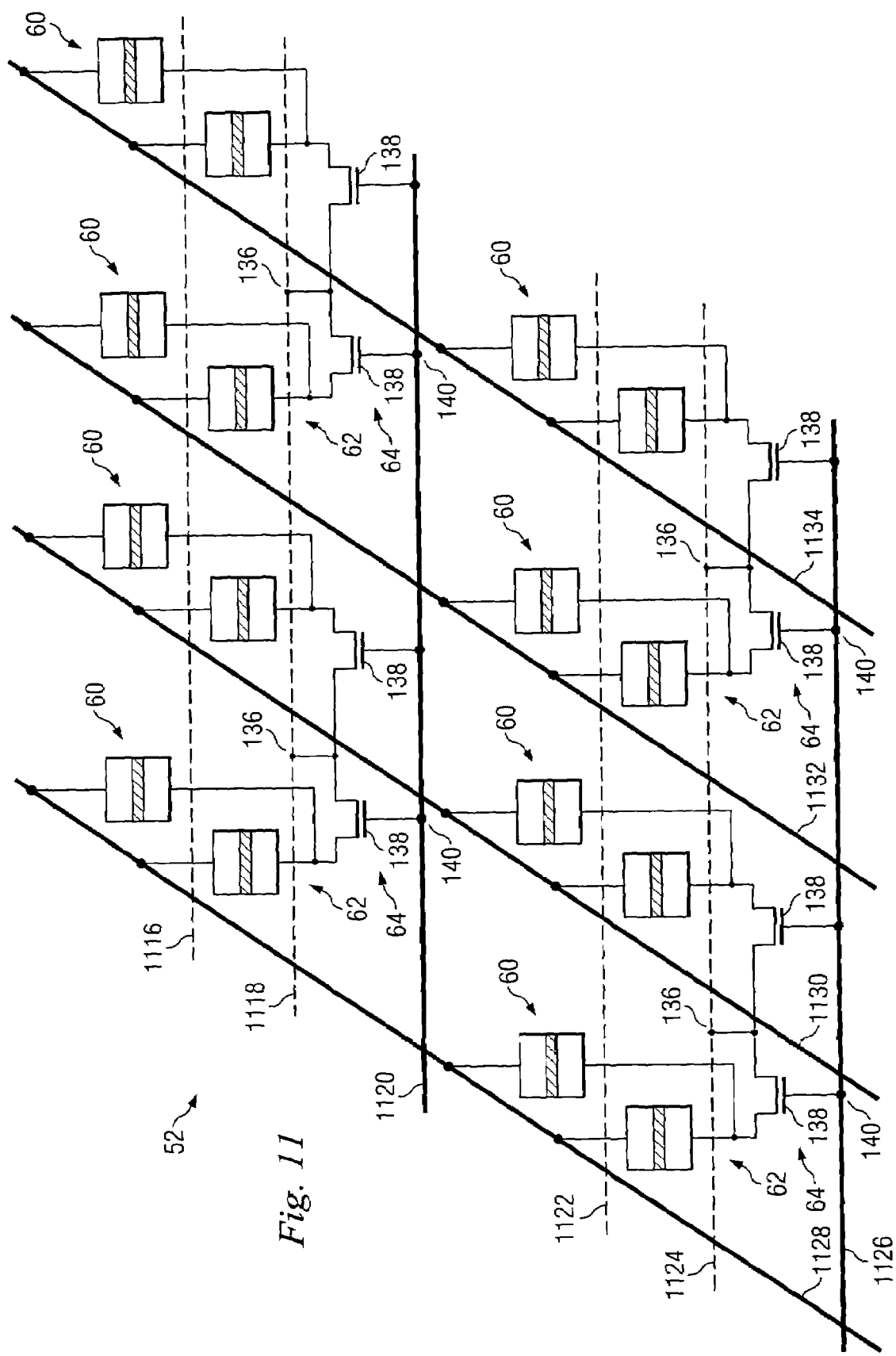

Referring now to FIGS. 10 and 11, in another group of embodiments, the MRAM cell 60 includes a switching device 64, for example a field effect transistor (FET), and two MTJ devices 1008 and 1010. For the sake of example, the MTJ devices 1008 and 1010 can be connected to one or more bit lines 1020 which carry the output voltage of the cell 60 in a read operation. The switching device 64 can be connected to one or more word lines 1022, which can activate the cell 60 for a read or write operation. The MTJ devices 1010 and 1008 can be written by an induced magnetic field from control lines 1024 and 1022, respectively. which can provide a current for producing a magnetic field to effect the MTJ devices 1008 and 1010. It is understood that the arrangement of bit lines, word lines, control lines, and other communication signals can vary for different circuit designs, and the present discussion is only providing one example of such an arrangement.

Referring specifically to FIG. 11, the memory cell array 52 comprises a plurality of MRAM cells 60 wherein write functions can be accomplished through the control lines 1116, 1118, 1122, and 1124; bit lines 1128, 1130, 1132, and 1134; and word lines 1120 and 1126. The control lines 1116, 1118, 1122, and 1124 can be coupled through a dielectric layer to the MTJ devices 1008 and 1010 and also to the two MRAM cells 60 at the drain junction 136.

In one example, to read an MRAM cell 60, a column select transistor (not shown) can be activated to select a specified bit line 1128, 1130, 1132, and 1134. Also, a selected word line 1120 or 1126 can be activated to turn on a specific transistor 138. Two specified control lines 1116 or 1118 and 1122 or 1124 are electrically grounded while the other control lines 1116 or 1118 and 1122 or 1124 are electrically floated with respect to ground. Generally, during the reading phase, a first bit line 1128, 1130, 1132, or 1134 can be activated, and the word lines 1120 and 1126 can be simultaneously and/or sequentially sampled. The process of reading individual MTJ devices 108 and 110 can be iterative, simultaneous and/or sequential for addressing other MTJ devices 108 and 110. The advantage of the memory cell array 52 can be that two MRAM cells 60 can be read from a single word line 1120 and 1126. This greatly increases the access speed of MRAM cells 60 and the overall density of the MRAM array 52.

In one write example, a control line 1116, 1118, 1122, or 1124 is activated associated with an MRAM cell. At least two control lines 1116, 1118, 1112, and/or 1124 could be selected to a corresponding MRAM cell 60 for programming. At the same time, two control lines 1116, 1118, 1112, and/or 1124 are simultaneously and/or sequentially activated, while the other control lines 1116, 1118, 1112, and/or 1124 can be electrically grounded. An associated bit line 1128, 1130, 1132, or 1134 can also be activated to simultaneously and/or sequentially program a corresponding MRAM cell 60 within the array 52. The data can be written by the combination of magnetic fields generated from the current flows of at least two control lines 1116, 1118, 1112, and or 1124 current flows.

Referring to FIG. 12, in one embodiment of the MRAM cell 60 for use in the memory cell array 52 of FIG. 11, the resistance of the tunneling barriers 1204, 1205 is related to the area of the MTJ devices 1212 and/or 1214. In one example, the tunneling barriers 1204, 1205 can be formed from insulating materials such as $Al_2O_3$ or other material to provide different MR ratios between MTJ devices 1212 and 1214. The thin barriers 1204, 1205 with different MR ratios could have the same or different thickness in MTJ devices 1212, 1214, respectively. The magnetic resistance of the MTJ devices 1212 or 1214 can change according to the direction of magnetization in the free layers 106. The product of the junction 1214 area and the barriers 1204, 1205 resistance can be constant. As a result, the larger area MTJ device 1212 could have a lower resistance.

Table 6, below, provides a sensing state example of asymmetrical area and/or asymmetrical barrier thickness for an MRAM cell. By adjusting the area ratio, almost equal signal windows for four states of sensing can be observed. For example, assuming an MR ratio of 30% under the bias voltage of a bit line 1228, 1230, 1232, and/or 1234, one MTJ device 1212 could have an MR ratio of 30% while MTJ device 1214 could have an MR ratio of 30% in an asymmetrical area junction MRAM cell 60. Therefore, logical binary state 1 could have 1 for MTJ device 1212 and 2 for MTJ 1214, while a binary logical state 0 could have 1.3 for MTJ device 1212 and 2.6 for MTJ 1214 in an MRAM cell 60.

TABLE 6

| Digital State | MTJ 1212 | MTJ 1214 | Rab \\ Rcd | MR Ratio |
|---|---|---|---|---|
| MTJ 1212 = 1 MTJ 1214 = 1 | 1 | 2 | 1 \\ 2 = 0.667 | |
| MTJ 1212 = 1 MTJ 1214 = 0 | 1 | 2.6 | 1 \\ 2.6 = 0.722 | (1, 1)/(1, 0) = 8.3% |
| MTJ 1212 = 0 MTJ 1214 = 1 | 1.3 | 2 | 1.3 \\ 2 = 0.788 | (1, 0)/(0, 1) = 9.1% |
| MTJ 1212 = 0 MTJ 1214 = 0 | 1.3 | 2.6 | 1.3 \\ 2.6 = 0.867 | (0, 1)/(0, 0) = 10% |

(Rab and Rcd represent the resistances between points a & b and points c & d, respectively, as shown in FIGS. 12–15.)

The area ratio of MTJ devices 1212 to MTJ devices 1214 could also be chosen to be 2:1, and the MR ratios could be 8.3%, 9.1% and 10% between four different MR sensing states. In one example, the two MTJ devices 1212 and/or 1214 of the MRAM cell 60 can be addressed by a field effect transistor (FET) 112 which can be attached to a plurality of MRAM cells 60 at the drain of the transistor 112. In the example, the gate of each transistor 112 of a MRAM cell 60 could be attached to a word line 1120 and 1126 of the array 52 in FIG. 11. A multi-level reference circuit can read out the state of each bit. However, the cell density of the area ratio based MRAM cell 60 can be limited by the chosen geometry and design rule.

Figure 13:
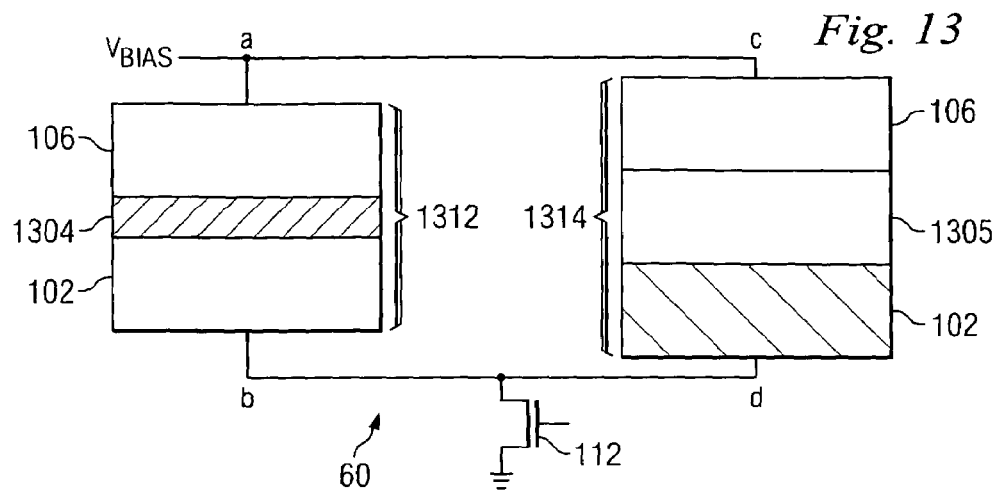
FIG. 13 illustrates a cross-sectional view of a second embodiment of an MRAM cell of FIG. 10 with a differing barrier thickness for each MTJ device.

Referring now to FIG. 13, in another embodiment of the MRAM cell 60 for use in the memory cell array 52 of FIG. 11, the MTJ devices 1312 and 1314 may have different barrier thicknesses 1304 and 1305, respectively. For example, if barrier 1305 is 1.41 times thicker than barrier 1304, the tunneling barrier magneto-resistance ratio of 1:2 would be similar to the configuration based upon the asymmetrical areas as described in FIG. 12. The tunneling barriers 1304, 1305 for example, could be formed by an material such as $Al_2O_3$ or other material to provide different magneto-ratios or MR ratios between MTJ 1312 and 1314. The barriers 1304, 1305 of different MR ratios could have different areas with different thickness. In one example, assuming an MR ratio of 30% under the bias voltage of a bit line 1128, 1130, 1132, and or 1134 (FIG. 11), one MTJ device 1312 could have an MR ratio of 30% while MTJ device 1314 could have and MR ratio of 50% in the asymmetrical area junction MRAM cell 60. Therefore, logical binary state 1 could have 1 for MTJ device 1312 and for MTJ device 1314, while a binary logical state 0 could have 1.3 for MTJ device 1312 and 4.5 for MTJ 1314 in the MRAM cell 60 of FIG. 13.

The gate of each switching device 112 of an MRAM cell 60 could be attached to a word line 1120 and/or 1126 of an array 52 as described in FIG. 11. A multi-level reference circuit can read out the state of each bit, but the MRAM cell 60 can be limited by the chosen geometry and design rule for the integrated circuit. In some cases, the magneto-resistance of the MTJ devices 1312 or 1314 can change according to the directions of magnetization in the free layer 106 of MTJ device 1312 and/or 1314. By adjusting the thickness ratio of MTJ device 1312 and MTJ device 1314 almost equal signal windows for four states of sensing can be observed similar to the case of an asymmetrical area MRAM cell 60 in FIG. 12. Table 6, above, can also represent a sensing state example of asymmetrical area and/or asymmetrical barrier thickness for an MRAM cell using the MTJ devices 1312 and 1314 instead of 1212 and 1214, respectively.

Figure 14:
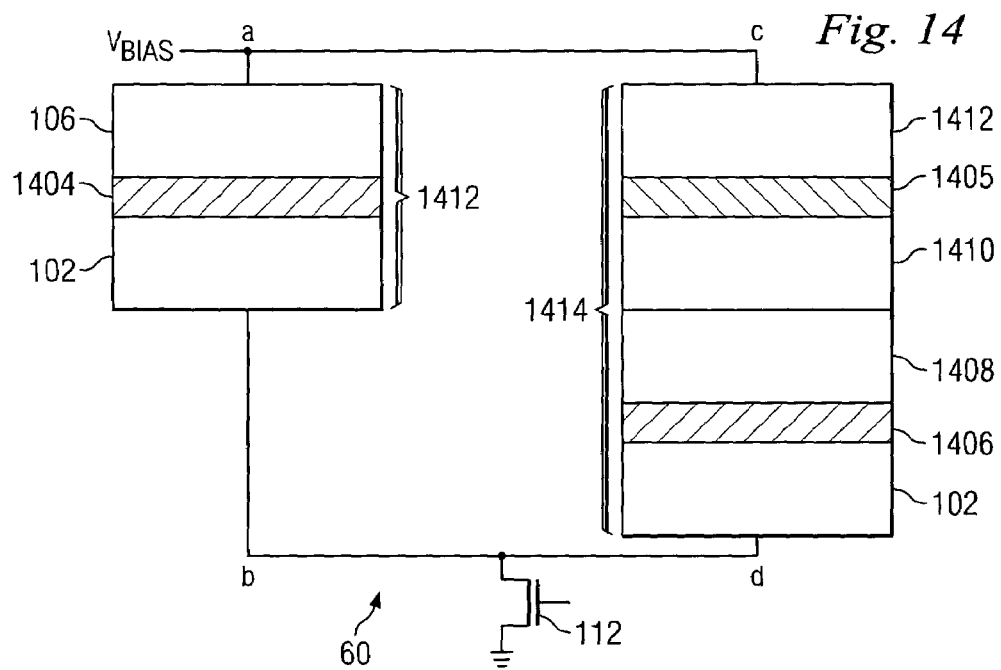
FIG. 14 illustrates a cross-sectional view of a third embodiment of an MRAM cell of FIG. 10 with a single junction MTJ device and a multiple junction MTJ device.

Referring now to FIG. 14, in yet another embodiment of the MRAM cell 60 for use in the memory cell array 52 of FIG. 11, a single junction MTJ device 1412 and a multiple junction MTJ device 1414 form a MTJ configuration. In one example, it is assumed that MTJ device 1412 could be a single junction type with a barrier 1404, while MTJ 1414 could be a multiple junction type with barriers 1405 and 1406. The barriers 1404–1406, for example, could be formed by an insulating materials such as $Al_2O_3$ or other material to provide different MR ratios. For example, thin barriers 1404–1406 could have different areas and/or different thicknesses to produce different MR ratios. The double or multiple junction MTJ device 1414 can be a simple electrical connection of two or more MTJ devices in series of a free layer 1412, barrier 1405, a pinned layer 1410, which is serially connected to a free layer 1408, barrier 1406 and the pinned layer 102. The multiple junction MTJ device 1414 can also be a sandwich structure of a pinned layer 1412, barrier 1405, a free layer 1410 sandwiched with free layer 1408, barrier 1406 with a different MR ratio, and the pinned layer 102. The free layer 102 could also be shared within the embodiment of the present disclosure. In the multiple junction MTJ device 1414, the MR ratio increases as the bias voltage decreases. Each junction of the double-junction structure MTJ device 1414 in FIG. 11 can share the bias voltage and take a lower bias voltage across the junction. Therefore, each junction may have a larger MR ratio. In this case, if it is assumed that the MR ratio of MTJ device 1412 is 30% under the bias voltage, the MR ratio of MTJ device 1414 could be 50%.

Table 7, below, shows sensing state example of a single MTJ and a multiple barrier MTJ, and the resultant MR ratio between each state. For example, one could assume an MR ratio of 30% under the bias voltage of a bit line 1128, 1130, 1132, and or 1134, one MTJ device 1412 could have an MR ratio of 30% while MTJ device 1414 could have and MR ratio of 50% in a single junction with multiple barrier 1304 MRAM cell 60. Therefore, logical binary state 1 can have 1 for MTJ device 1412 and 3 for MTJ device 1414. A binary logical state 0 can have 1.3 for MTJ device 1412 and 4.5 for MTJ device 1414 in a single junction MTJ device 1412 with multiple barriers 1304. The gate of each switching device 112 of an MRAM cell 60 can be attached to a word line 1120 and/or 1126 of an array as described in FIG. 11. A multi-level reference circuit can read the state of each bit, however the MRAM cell 60 can be limited by the chosen geometry and design rule for the integrated circuit.

TABLE 7

| Digital State | MTJ 1412 | MTJ 1414 | Rab \\ Rcd | MR Ratio |
|---|---|---|---|---|
| MTJ 1412 = 1<br>MTJ 1414 = 1 | 1 | 3 | 1 \\ 3 = 0.750 | |
| MTJ 1412 = 1<br>MTJ 1414 = 0 | 1 | 4.5 | 1 \\ 4.5 = 0.818 | (1, 1)/(1, 0) = 9.1% |
| MTJ 1412 = 0<br>MTJ 1414 = 1 | 1.3 | 3 | 1.3 \\ 3 = 0.907 | (1, 0)/(0, 1) = 10.9% |
| MTJ 1412 = 0<br>MTJ 1414 = 0 | 1.3 | 4.5 | 1.3 \\ 4.5 = 1.009 | (0, 1)/(0, 0) = 11.2% |

Figure 15:
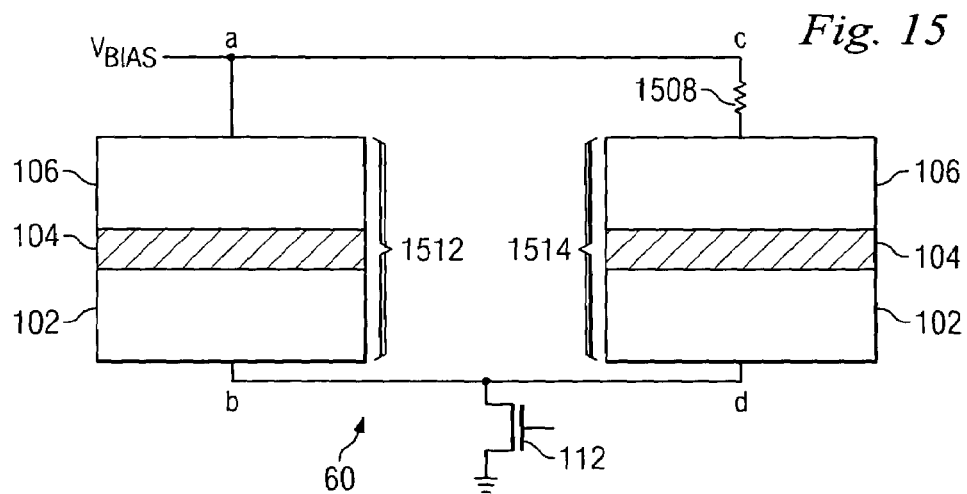
FIG. 15 illustrates a cross-sectional view of a fourth embodiment of an MRAM cell of FIG. 10 with a single junction MTJ device and a single junction MTJ device in series with a resistor.

Referring now to FIG. 15, in another embodiment of the MRAM cell 60 for use in the memory cell array 52 of FIG. 11, a single junction MTJ device 1512 is connected in series with a single junction MTJ device 1514 attached to a resistor 1508. The resistor 1508 plays the role of sharing of bias voltage from a bit line 1128, 1130, 1132, and/or 1134. The resistor 1508 can be made from materials such as, for example, a layer of diamond-like carbon (DLC), a layer of Ti/Ta/X, where X is a metal, a layer of Ti/TaN/TiW, and other materials. The material and/or thickness of the resistive element are selected so that the resistive element does not behave as an anti-fuse as discussed above with reference to FIG. 4.

The gate of each switching device 112 of the MRAM 60 can be attached to a word line 1120 and/or 1126 of the MRAM array 52. A multi-level reference circuit can read out the state of each bit, however the MRAM 60 can be limited by the chosen geometry and design rule for the integrated circuit The above embodiments illustrate only a few variations of the MRAM cell 60 structure. The present disclosure is not limited simply to structures with one switching device and two MTJ devices. Rather, it can be extended to allow for multiple MTJ devices attached to a single switching device.

According to the above embodiments, the MTJ configurations 62 may not require active silicon-based isolation elements in order to isolate the memory cells in a memory array. The MTJ configuration 62 may be stacked memory elements or even three-dimensionally connected for fabrication on non-planar surfaces, curved, and spherical geometries, increasing device capacity. The MTJ configuration 62 may be fabricated by materials that are novel or non-conventional by semiconductor technologies.

An advantage of using MTJ configurations and configurations with multiple level sensing capabilities is that each MTJ configuration in the above discussed embodiments exhibits its own resistance characteristic due to the differing MR ratios of each MTJ configuration. The MR ratio of each MTJ can be controlled by differing the material or composition of each tunneling barrier 104 and 108. This allows each stacked MTJ configuration 62, as shown in FIG. 3, or the un-stacked configurations of FIGS. 4 and 5 to simultaneously store two bits. The present embodiments of the MTJ configuration 62 have the ability to sense at least four different logical states based on the differing MR ratios, and this allows for a two times increase in memory density within the same or similar area used in a single MTJ configuration.

Based on the illustrated embodiments, one of ordinary skill in the art can easily apply the teachings of the present disclosure to create MTJ configurations that can store greater than two bits with greater than four levels of MR sensing. Likewise, one of ordinary skill in the art can easily apply the teachings of the present disclosure to other semiconductor devices and structures using multiple level sensing with different MR ratio MRAM cells.

The invention claimed is:

1. A magnetic memory cell comprising:
   a switching element;
   a first magnetic tunnel junction (MTJ) device having a first resistance, the first MTJ device including a first tunnel barrier;
   a second MTJ device having a second resistance, the second MTJ device including a second tunnel barrier, wherein the first tunnel barrier has a magneto-resistance (MR) ratio that differs from a MR ratio of the second tunneling barrier; and
   a conductor for connecting the first and second MTJ devices in a parallel configuration and for serially connecting the parallel configuration of the first and second MTJ devices to an electrode of the switching element;
   wherein the first resistance is different from the second resistance.

2. The magnetic memory cell of claim 1 wherein the first MTJ device includes a first tunnel barrier that is of a different area than a tunnel barrier of the second MTJ device.

3. The magnetic memory cell of claim 1 wherein the first MTJ device includes a first tunnel barrier that is of a different thickness than a tunnel barrier of the second MTJ device.

4. The magnetic memory cell of claim 1 wherein the first MTJ device is a multi-junction MTJ device.

5. The magnetic memory cell of claim 1 further comprising:
   a resistor in series with the second MTJ device; wherein the second resistance is a combination of a resistance of the second MTJ device and the resistor.

6. The magnetic memory cell of claim 1 further comprising:
   a conductive member forming at least a portion of one of a bit line and a word line, the portion being connected in series with the second MTJ device;
   wherein the second resistance is a combination of a resistance of the second MTJ device and the conductive member.

7. The MTJ configuration of claim 1 wherein the first MTJ device includes a synthetic anti-ferromagnetic free layer.

8. The MTJ configuration of claim 1 wherein the switching element is a transistor.

9. A magnetic memory cell comprising:
   first, second, and third terminals;
   a conductor;
   a CMOS transistor having source, drain, and gate electrodes, the gate electrode connected to the third terminal, one of either the source or drain connected to the second terminal, and the other of either the source or drain connected to the conductor;
   a first magnetic tunnel junction (MTJ) device including a serially connected first free layer, first tunneling barrier, and first pinned layer, the first free layer also being connected to the first terminal and the first pinned layer also being connected to the conductor; and
   a second MTJ device including a serially connected second free layer, second tunneling barrier, and second pinned layer, the second free layer also being connected to the first terminal and the second pinned layer also being connected to the conductor;
   wherein a first resistance between the first terminal to the second terminal through the first MTJ device is different from a second resistance between the first terminal to the second terminal through the second MTJ device.

10. The magnetic memory cell of claim 9 wherein the second resistance is twice the first resistance.

11. The magnetic memory cell of claim 9 wherein the first tunneling barrier is of a different size than the second tunneling barrier.

12. The magnetic memory cell of claim 9 wherein the first tunneling barrier is of a different composition than the second tunneling barrier.

13. The magnetic memory cell of claim 9 wherein the first MTJ device further comprises another free layer, tunneling barrier, and pinned layer serially connected between the first free layer and the first pinned layer.

14. The magnetic memory cell of claim 13 wherein the first MTJ device is a sandwiched pair of MTJ structures.

15. The magnetic memory cell of claim 13 wherein the first MTJ device is a serially connected pair of MTJ structures.

16. The magnetic memory cell of claim 9 further comprising:
   a resistor in series with the second MTJ device between the first terminal and the conductor;
   wherein the second resistance is a combination of a resistance of the second MTJ device and the resistor.

17. An integrated circuit comprising:
   a plurality of bit lines, word lines, and program lines;
   a plurality of magnetic memory cells, each including:
      a conductor;
      a transistor having source, drain, and gate electrodes, the gate electrode connected to one of the word lines, one of either the source or drain connected to a first program line, and the other of either the source or drain connected to the conductor;
      a first magnetic tunnel junction (MTJ) device including a serially connected first free layer, first tunneling barrier, and first pinned layer, the first free layer also being connected to a first bit line and the first pinned layer also being connected to the conductor; and
      a second MTJ device including a serially connected second free layer, second tunneling barrier, and second pinned layer, the second free layer also being connected to the first bit line and the second pinned layer also being connected to the conductor
      wherein a first resistance between the first bitline to the conductor through the first MTJ device is different from a second resistance between the first bitline to the conductor through the second MTJ device.

18. The integrated circuit of claim 17 wherein a first magneto-resistance of the first magnetic junction device is different from a second magneto-resistance of the second magnetic junction device.

* * * * *

UNITED STATES PATENT AND TRADEMARK OFFICE
CERTIFICATE OF CORRECTION

PATENT NO. : 7,166,881 B2  Page 1 of 1
APPLICATION NO. : 10/685824
DATED : July 23, 2007
INVENTOR(S) : Wen Chin Lin, Denny D. Tang and Chien-Chung Hung It is certified that error appears in the above-identified patent and that said Letters Patent is hereby corrected as shown below:

Title Page, item (22) "Filed: August 23, 2004" should be corrected to
--Filed: October 13, 2003--

Signed and Sealed this

Twenty-sixth Day of February, 2008

JON W. DUDAS
*Director of the United States Patent and Trademark Office*

UNITED STATES PATENT AND TRADEMARK OFFICE
CERTIFICATE OF CORRECTION

PATENT NO. : 7,166,881 B2  Page 1 of 1
APPLICATION NO. : 10/685824
DATED : July 23, 2007
INVENTOR(S) : Wen Chin Lin, Denny D. Tang and Chien-Chung Hung It is certified that error appears in the above-identified patent and that said Letters Patent is hereby corrected as shown below:

Title page, item (22) "Filed: August 23, 2004" should be corrected to
--Filed: October 13, 2003--

Signed and Sealed this

Eleventh Day of March, 2008

JON W. DUDAS
*Director of the United States Patent and Trademark Office*

UNITED STATES PATENT AND TRADEMARK OFFICE
CERTIFICATE OF CORRECTION

| | | |
|---|---|---|
| PATENT NO. | : 7,166,881 B2 | Page 1 of 1 |
| APPLICATION NO. | : 10/685824 | |
| DATED | : January 23, 2007 | |
| INVENTOR(S) | : Wen Chin Lin, Denny D. Tang and Chien-Chung Hung | |

It is certified that error appears in the above-identified patent and that said Letters Patent is hereby corrected as shown below:

Title Page, item (22) "Filed: August 23, 2004" should be corrected to
--Filed: October 13, 2003--

This certificate supersedes the Certificate of Correction issued February 26, 2008.

Signed and Sealed this

Eighteenth Day of March, 2008

JON W. DUDAS
*Director of the United States Patent and Trademark Office*

UNITED STATES PATENT AND TRADEMARK OFFICE
CERTIFICATE OF CORRECTION

| | | |
|---|---|---|
| PATENT NO. | : 7,166,881 B2 | Page 1 of 1 |
| APPLICATION NO. | : 10/685824 | |
| DATED | : January 23, 2007 | |
| INVENTOR(S) | : Wen Chin Lin, Denny D. Tang and Chien-Chung Hung | |

It is certified that error appears in the above-identified patent and that said Letters Patent is hereby corrected as shown below:

Title page, item (22) "Filed: August 23, 2004" should be corrected to
--Filed: October 13, 2003--

This certificate supersedes the Certificate of Correction issued February 26, 2008 and March 11, 2008.

Signed and Sealed this

First Day of April, 2008

JON W. DUDAS
*Director of the United States Patent and Trademark Office*